United States Patent
Miyake et al.

(10) Patent No.: US 10,855,196 B2
(45) Date of Patent: Dec. 1, 2020

(54) SEMICONDUCTOR DEVICE

(71) Applicants: Kabushiki Kaisha Toshiba, Minato-ku (JP); Toshiba Electronic Devices & Storage Corporation, Minato-ku (JP)

(72) Inventors: Eitaro Miyake, Kawasaki (JP); Hiroshi Matsuyama, Himeji (JP); Tatsuya Hirakawa, Takasago (JP); Kazuya Kodani, Kawasaki (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/536,921

(22) Filed: Aug. 9, 2019

(65) Prior Publication Data
US 2020/0304035 A1  Sep. 24, 2020

(30) Foreign Application Priority Data
Mar. 18, 2019  (JP) ................. 2019-050530

(51) Int. Cl.
*H02M 7/00* (2006.01)
*H05K 7/14* (2006.01)
*H01L 23/00* (2006.01)

(52) U.S. Cl.
CPC ............ *H02M 7/003* (2013.01); *H01L 24/49* (2013.01); *H01L 2224/48139* (2013.01); *H01L 2924/1305* (2013.01); *H01L 2924/13055* (2013.01); *H01L 2924/13091* (2013.01); *H05K 7/1432* (2013.01)

(58) Field of Classification Search
CPC ........... H02M 7/003; H01L 2924/1305; H05K 7/1432

USPC ......... 257/676, E21.499; 363/131, 132, 147; 438/107, 123
See application file for complete search history.

(56) References Cited

U.S. PATENT DOCUMENTS 9,741,587 B2 *  8/2017  Nakajima ............... H01L 24/37
9,979,314 B2    5/2018  Obiraki et al.
(Continued)

FOREIGN PATENT DOCUMENTS

EP    2 590 309 A1    5/2013
JP    2012-23135 A    2/2012
(Continued)

*Primary Examiner* — Gary A Nash
(74) *Attorney, Agent, or Firm* — Oblon, McClelland, Maier & Neustadt, L.L.P.

(57) ABSTRACT

A semiconductor device including a main board; a first board provided on the main board; first and second semiconductor elements provided on the first board; a first positive terminal provided on the first board; a first negative terminal provided on the first board; a first output terminal provided on the first board; a second board provided on the main board; third and fourth semiconductor elements provided on the second board; a second positive terminal provided on the second board; a second negative terminal provided on the second board; a second output terminal provided on the second board; a first terminal plate connecting the first positive terminal and the second positive terminal, a second terminal plate connecting the first negative terminal and the second negative terminal, and a third terminal plate connecting the first output terminal and the second output terminal.

14 Claims, 6 Drawing Sheets

(56) References Cited

U.S. PATENT DOCUMENTS

| | | | | |
|---|---|---|---|---|
| 2004/0041201 A1* | 3/2004 | Sugiyama | ............ | H01L 29/407 257/316 |
| 2007/0246812 A1* | 10/2007 | Zhuang | ................. | H01L 24/34 257/678 |
| 2009/0225577 A1* | 9/2009 | Onishi | ................. | H02M 7/003 363/131 |
| 2015/0287665 A1* | 10/2015 | Hanada | ............... | H01L 23/482 257/691 |
| 2016/0005670 A1* | 1/2016 | Iizuka | ............... | H01L 23/3675 257/693 |
| 2016/0057881 A1* | 2/2016 | Tada | ................... | H05K 7/1432 361/728 |
| 2017/0256483 A1* | 9/2017 | Matsuyama | .......... | H01L 25/072 |

FOREIGN PATENT DOCUMENTS

| | | |
|---|---|---|
| JP | 5090063 B2 | 12/2012 |
| JP | 5707302 B2 | 4/2015 |
| JP | 6188902 B2 | 8/2017 |

* cited by examiner

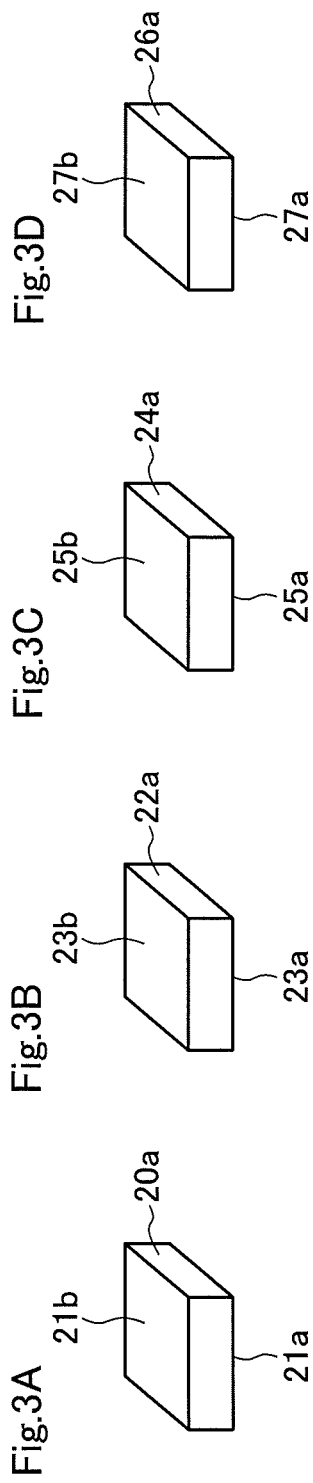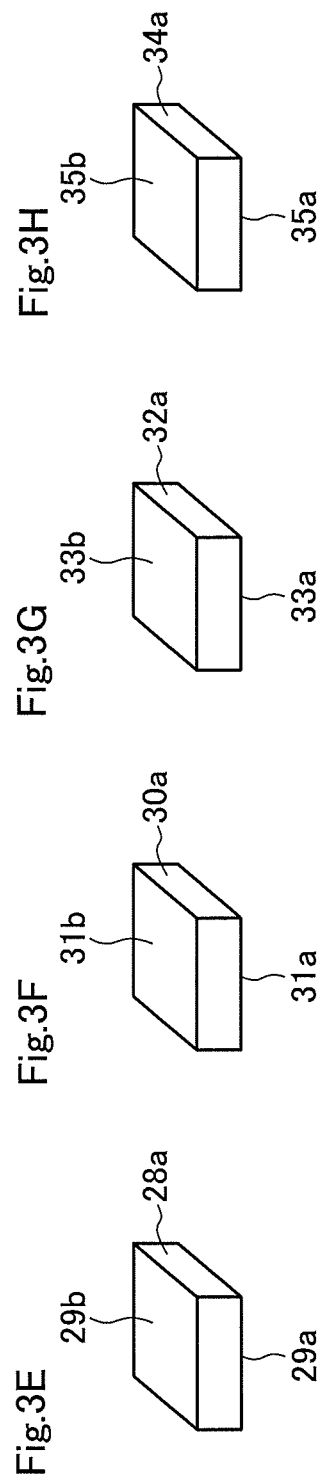

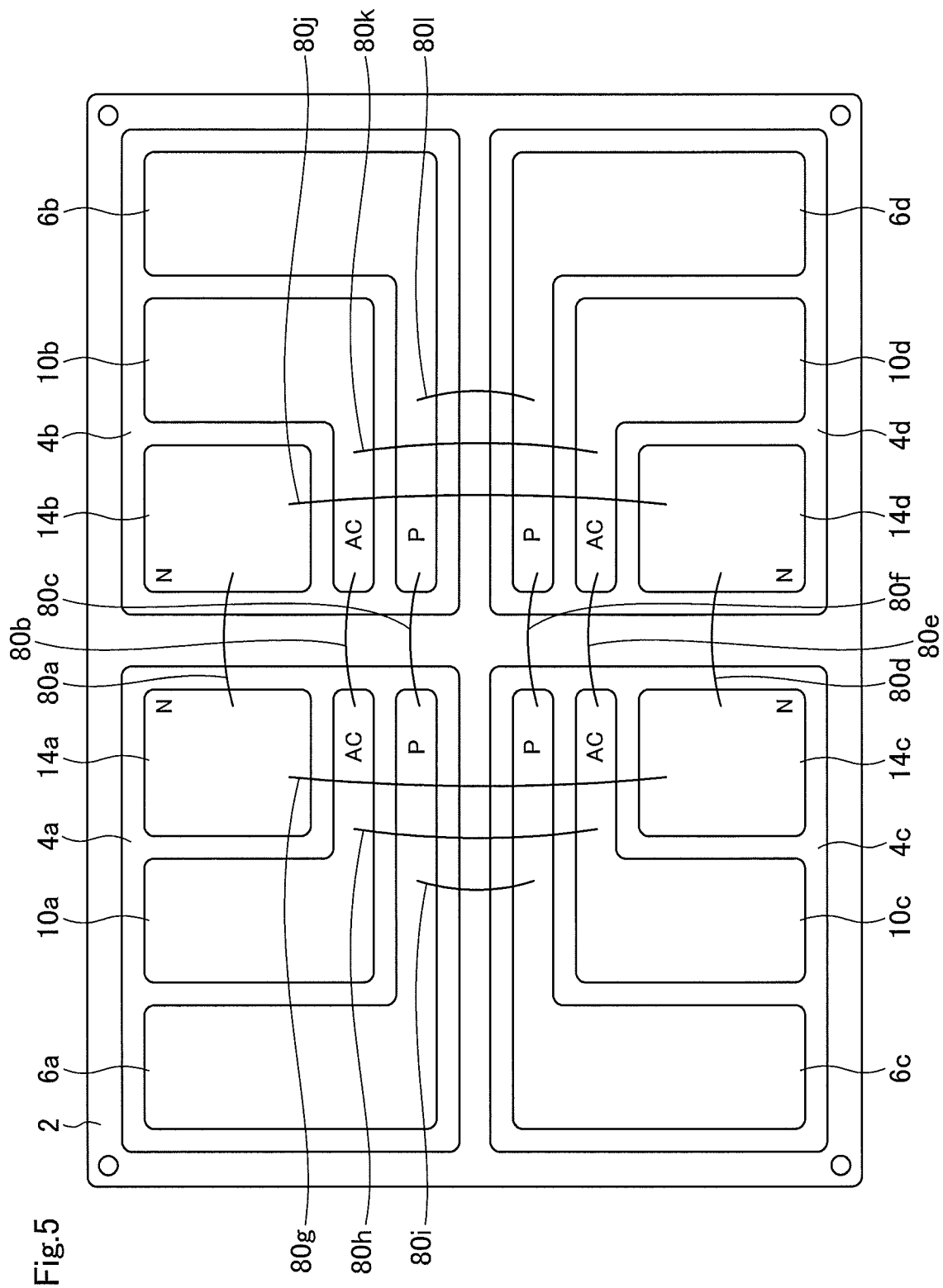

SEMICONDUCTOR DEVICE

CROSS-REFERENCE TO RELATED APPLICATION

This application is based upon and claims the benefit of priority from Japanese Patent Application No. 2019-050530, filed on Mar. 18, 2019, the entire contents of which are incorporated herein by reference.

FIELD

Embodiments described herein relate generally to a semiconductor device.

BACKGROUND

Power semiconductor devices designed for power control, including semiconductor elements such as metal-oxide-semiconductor field-effect-transistors (MOSFETs) and insulated gate bipolar transistors (IGBTs) for a wide range of fields such as power generation and transmission, rotating machines such as pumps and blowers, power supplies for communication systems and factories, railways with AC motors, electric vehicles, and home appliances have been developed.

Usually, in the power semiconductor device, a plurality of semiconductor elements provided on a base (substrates) can be connected in parallel by using bonding wires or terminal plates to enable handling large power.

BRIEF DESCRIPTION OF THE DRAWINGS

FIGS. 3A to 3H are schematic perspective views of the semiconductor element according to the embodiment;

FIG. 5 is a schematic view of wires of the embodiment; and

DETAILED DESCRIPTION

Figure 1:
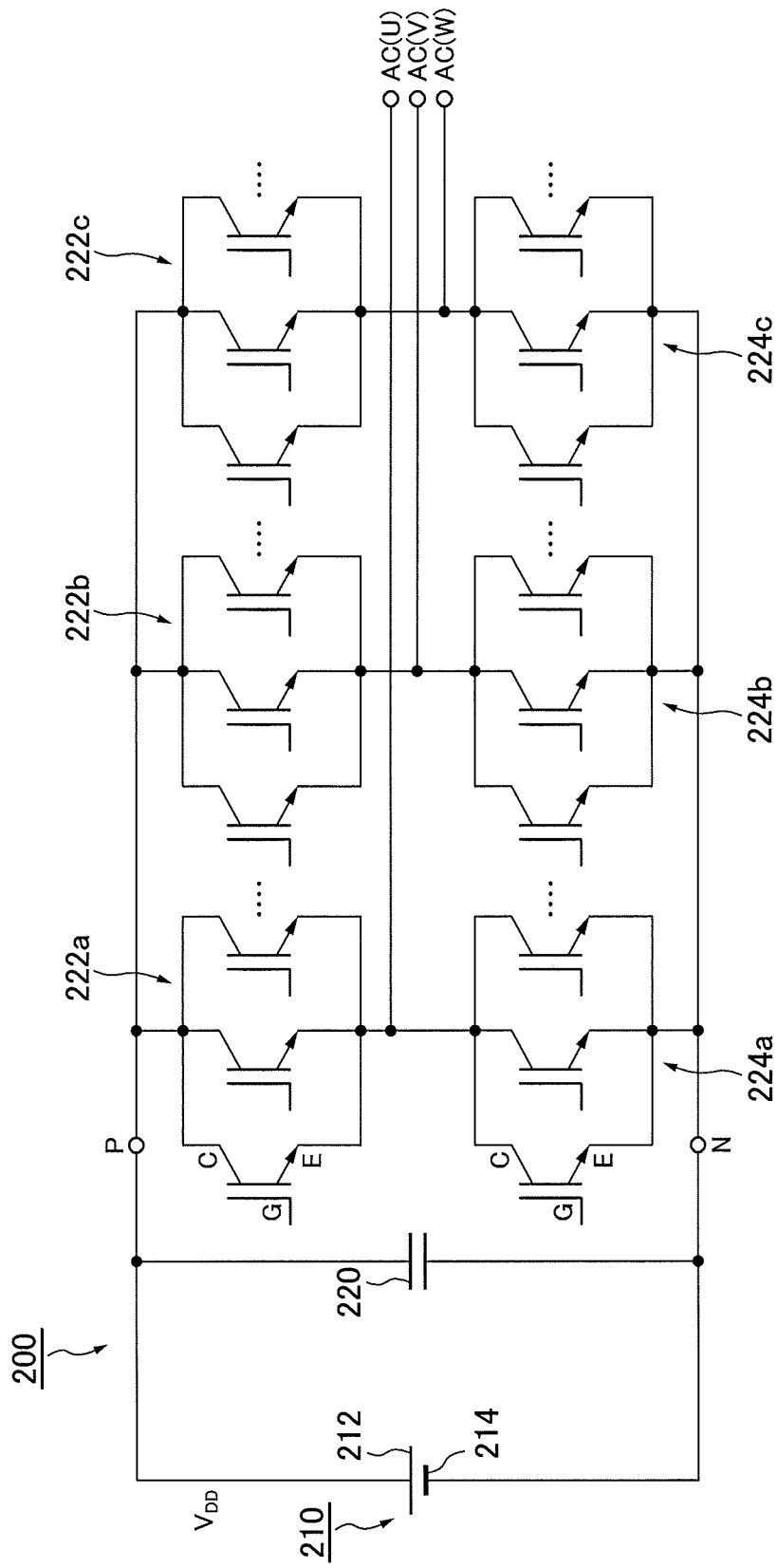
FIG. 1 is a schematic circuit diagram of a semiconductor device according to an embodiment.

Hereinafter, embodiments will be described with reference to the drawings. In the drawings, the same or similar components are denoted by the same or similar reference numerals.

In the present specification, the same or similar members will be denoted by the same reference numerals, and redundant descriptions may be omitted.

In the present specification, in order to indicate the positional relationship of parts and the like, the upper direction of the drawing is described as "upper" and the lower direction of the drawing as "lower". In the present specification, the terms "upper" and "lower" are not necessarily terms indicating the relationship with the direction of gravity.

Embodiment

A semiconductor device according to the embodiment includes: a main board; a first board provided on the main board; first semiconductor elements provided on the first board; second semiconductor elements provided on the first board, a first positive terminal provided on the first board; a first negative terminal provided on the first board; a first output terminal provided on the first board; a second board provided on the main board; third semiconductor elements provided on the second board; fourth semiconductor elements provided on the second board; a second positive terminal provided on the second board; a second negative terminal provided on the second board; a second output terminal provided on the second board; and at least one terminal plate of a first terminal plate connecting the first positive terminal and the second positive terminal, a second terminal plate connecting the first negative terminal and the second negative terminal, and a third terminal plate connecting the first output terminal and the second output terminal.

FIG. 1 is a schematic circuit diagram of a power conversion device 200 of the embodiment. The power conversion device 200 of the embodiment is an inverter circuit. The semiconductor device 100 according to the embodiment is used as a portion of the power conversion device 200.

The power conversion device 200 includes a plurality of high side transistors 222a, 222b, and 222c connected in parallel to each other and a plurality of low side transistors 224a, 224b, and 224c connected in parallel to each other. The high side transistor 222a and the low side transistor 224a are connected in series. Similarly, the high side transistor 222b and the low side transistor 224b are connected in series, and the high side transistor 222c and the low side transistor 224c are connected in series.

The high side transistors 222a, 222b, and 222c and the low side transistors 224a, 224b, and 224c are, for example, IGBTs. However, these transistors may be MOSFETs or the like. In addition, the number of high side transistors 222a, 222b, and 222c and the number of low side transistors 224a, 224b, and 224c are not particularly limited.

A positive electrode 212 of a DC power supply 210 and one end of a smoothing capacitor 220 are connected to the high side transistors 222a, 222b, and 222c via a positive terminal P. A negative electrode 214 of the DC power supply 210 and the other end of the smoothing capacitor 220 are connected to the low side transistors 224a, 224b, and 224c via a negative terminal N.

An output terminal AC (U) is connected between the high side transistor 222a and the low side transistor 224a, an output terminal AC (V) is connected between the high side transistor 222b and the low side transistor 224b, and an output terminal AC (W) is connected between the high side transistor 222c and the low side transistor 224c.

Figure 2:
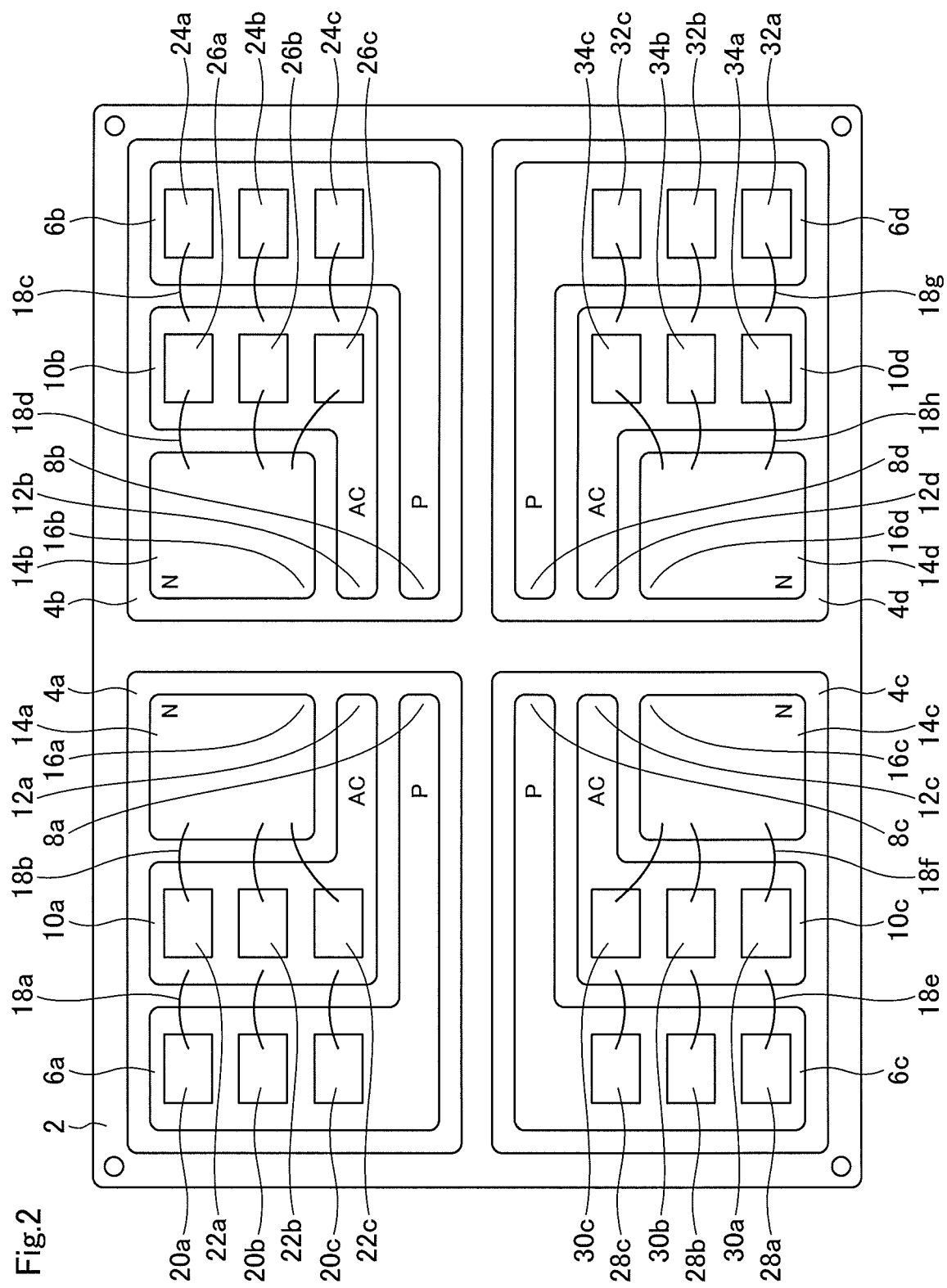
FIG. 2 is a schematic perspective view of a main board, boards, electrode members, semiconductor elements, and bonding wires in the semiconductor device according to the embodiment.

FIG. 2 is a schematic top view of a main board, boards, electrode members, semiconductor elements, and the wiring in the semiconductor device 100 of the embodiment.

The main board 2 is made of, for example, copper (Cu) or AlSiC, has electrical conductivity, and has a plate shape.

A first board 4a, a second board 4b, a third board 4c, and a fourth board 4d are provided on the main board 2. As illustrated in FIG. 2, the first board 4a and the second board 4b are disposed adjacent to each other, and the first board 4a and the third board 4c are disposed adjacent to each other. In addition, the fourth board 4d and the second board 4b are disposed adjacent to each other, and the fourth board 4d and the third board 4c are disposed adjacent to each other. The first board 4a, the second board 4b, the third board 4c, and the fourth board 4d are plate-shaped boards made of an insulating ceramic such as aluminum nitride (AlN) or silicon nitride (SiN).

A first electrode member 6a, a second electrode member 10a, and a third electrode member 14a (an example of a fifth electrode member) are provided on the first board 4a so as not to overlap with each other. The first electrode member 6a, the second electrode member 10a, and the third electrode member 14a are, for example, plate-shaped members made of Cu, respectively. In FIG. 2, each of the first electrode member 6a and the second electrode member 10a has an L shape. A first planar portion 8a (an example of a first positive terminal) and a second planar portion 12a (an example of a first output terminal), which are the respective end portions of the first electrode member 6a and the second electrode member 10a, are provided close to the second board 4b (on the side of the second board 4b). On the other hand, in FIG. 2, the third electrode member 14a has a rectangular shape and has a third planar portion 16a (an example of a first negative terminal). The shapes of the first electrode member 6a, the second electrode member 10a, and the third electrode member 14a are not limited to these shapes.

First semiconductor elements 20a, 20b, and 20c are provided on the first electrode member 6a, for example, in a portion separated from the first planar portion 8a. The first semiconductor elements 20a, 20b, and 20c are, for example, IGBTs. However, the semiconductor elements may be MOSFETs or the like. In particular, since n-type MOSFETs generally have better switching characteristics than p-type MOSFETs, the n-type MOSFETs are preferably used. The first semiconductor elements 20a, 20b, and 20c correspond to the high side transistors illustrated in FIG. 1. In addition, the number of first semiconductor elements is not particularly limited.

FIGS. 3A to 3H illustrate schematic perspective views of the semiconductor element according to the embodiment. The first semiconductor element 20a illustrated in FIG. 3A has a first electrode (an example of a collector electrode) 21a on the lower surface and a second electrode (an example of an emitter electrode) 21b on the upper surface. In addition, the same applies to the first semiconductor elements 20b and 20c.

The second semiconductor elements 22a, 22b, and 22c are provided on the second electrode member 10a, for example, in a portion separated from the second planar portion 12a. The second semiconductor elements 22a, 22b, and 22c are, for example, IGBTs. However, the semiconductor elements may be MOSFETs or the like. In particular, since n-type MOSFETs generally have better switching characteristics than p-type MOSFETs, the n-type MOSFETs are preferably used. The second semiconductor elements 22a, 22b, and 22c correspond to the low side transistors illustrated in FIG. 1. In addition, the number of second semiconductor elements is not particularly limited.

The second semiconductor element 22a illustrated in FIG. 3B has a third electrode (an example of a collector electrode) 23a on the lower surface and a fourth electrode (an example of an emitter electrode) 23b on the upper surface. In addition, the same applies to the second semiconductor elements 22b and 22c.

A first wire 18a electrically connects the second electrode of the first semiconductor element and the second electrode member 10a. A second wire 18b electrically connects the fourth electrode of the second semiconductor element and the third electrode member 14a. The first wire 18a and the second wire 18b are, for example, bonding wires. However, the wires are not limited to the bonding wires.

A fourth electrode member 6b (an example of a third electrode member), a fifth electrode member 10b (an example of a fourth electrode member), and a sixth electrode member 14b are provided on the second board 4b so as not to overlap with each other. The fourth electrode member 6b, the fifth electrode member 10b, and the sixth electrode member 14b are, for example, plate-shaped members made of Cu. In FIG. 2, each of the fourth electrode member 6b and the fifth electrode member 10b has an L shape. A fourth planar portion 8b (an example of the second positive terminal) and a fifth planar portion 12b (an example of the second output terminal), which are the respective end portions of the fourth electrode member 6b and the fifth electrode member 10b, are provided close to the first board 4a (on the side of the first board 4a). On the other hand, in FIG. 2, the sixth electrode member 14b has a rectangular shape and has a sixth planar portion 16b (an example of a second negative terminal). The shapes of the fourth electrode member 6b, the fifth electrode member 10b, and the sixth electrode member 14b are not limited to these shapes.

Third semiconductor elements 24a, 24b, and 24c are provided on the fourth electrode member 6b, for example, in a portion separated from the fourth planar portion 8b. The third semiconductor elements 24a, 24b, and 24c are, for example, IGBTs. However, the semiconductor elements may be MOSFETs or the like. In particular, n-type MOSFETs are preferably used. The third semiconductor elements 24a, 24b, and 24c correspond to the high side transistors illustrated in FIG. 1. In addition, the number of third semiconductor elements is not particularly limited.

The third semiconductor element 24a illustrated in FIG. 3C has a fifth electrode (an example of a collector electrode) 21a on the lower surface and a sixth electrode (an example of an emitter electrode) 21b on the upper surface. In addition, the same applies to the third semiconductor elements 24b and 24c.

Fourth semiconductor elements 26a, 26b, and 26c are provided on the fifth electrode member 10b, for example, in a portion separated from the fifth planar portion 12b. The fourth semiconductor elements 26a, 26b, and 26c are, for example, IGBTs. However, the semiconductor elements may be MOSFETs or the like. In particular, n-type MOSFETs are preferably used. The fourth semiconductor elements 26a, 26b, and 26c correspond to the low side transistors illustrated in FIG. 1. In addition, the number of fourth semiconductor elements is not particularly limited.

The fourth semiconductor element 26a illustrated in FIG. 3D has a third electrode (an example of a collector electrode) 27a on the lower surface and a fourth electrode (an example of an emitter electrode) 27b on the upper surface. In addition, the same applies to the fourth semiconductor elements 26b and 26c.

A third wire 18c electrically connects the sixth electrode of the third semiconductor element and the fifth electrode member 10b. A fourth wire 18d electrically connects the eighth electrode of the fourth semiconductor element and the sixth electrode member 14b. The third wire 18c and the fourth wire 18d are, for example, bonding wires. However, the wires are not limited to the bonding wires.

A seventh electrode member 6c (an example of an eleventh electrode member), an eighth electrode member 10c (an example of a ninth electrode member), and a ninth electrode member 14c (an example of a seventh electrode member) are formed on the third board 4c are provided so as not to overlap each other. Each of the seventh electrode member 6c, the eighth electrode member 10c, and the ninth electrode member 14c is, for example, a plate-shaped member made of Cu. In FIG. 2, each of the seventh electrode member 6c and the eighth electrode member 10c has an L shape. A seventh planar portion 8c (an example of the third positive terminal) and an eighth planar portion 12c (an example of the third output terminal), which are the respective end portions of the seventh electrode member 6c and the eighth electrode member 10c, are provided close to the fourth board 4d (on the side of the fourth board 4d). On the other hand, in FIG. 2, the ninth electrode member 14c has a rectangular shape and has a ninth planar portion 16c (an example of a third negative terminal). The shapes of the seventh electrode member 6c, the eighth electrode member 10c, and the ninth electrode member 14c are not limited to these shapes.

Fifth semiconductor elements 28a, 28b, and 28c are provided on the seventh electrode member 6c, for example, in a portion separated from the seventh planar portion 8c. The fifth semiconductor elements 28a, 28b, and 28c are, for example, IGBTs. However, the semiconductor elements may be MOSFETs or the like. In particular, n-type MOSFETs are preferably used. The fifth semiconductor elements 28a, 28b, and 28c correspond to the high side transistors illustrated in FIG. 1. In addition, the number of fifth semiconductor elements is not particularly limited.

The fifth semiconductor element 28a illustrated in FIG. 3E has a ninth electrode (an example of a collector electrode) 29a on the lower surface and a tenth electrode (an example of an emitter electrode) 29b on the upper surface. In addition, the same applies to the fifth semiconductor elements 28b and 28c.

Sixth semiconductor elements 30a, 30b, and 30c are provided on the eighth electrode member 10c, for example, in a portion separated from the eighth planar portion 12c. The sixth semiconductor elements 30a, 30b, and 30c are, for example, IGBTs. However, the semiconductor elements may be MOSFETs or the like. In particular, n-type MOSFETs are preferably used.

The sixth semiconductor elements 30a, 30b, and 30c correspond to the low side transistors illustrated in FIG. 1. In addition, the number of sixth semiconductor elements is not particularly limited.

The sixth semiconductor element 30a illustrated in FIG. 3F has an eleventh electrode (an example of a collector electrode) 31a on the lower surface and a twelfth electrode (an example of an emitter electrode) 31b on the upper surface. In addition, the same applies to the sixth semiconductor elements 30b and 30c.

A fifth wire 18e electrically connects the tenth electrode of the fifth semiconductor element and the eighth electrode member 10c. A sixth wire 18f electrically connects the twelfth electrode of the sixth semiconductor element and the ninth electrode member 14c. The fifth wire 18e and the sixth wire 18f are, for example, bonding wires. However, the wires are not limited to the bonding wires.

A tenth electrode member 6d, an eleventh electrode member 10d (an example of a tenth electrode member), and a twelfth electrode member 14d (an example of an eighth electrode member) are provided on the fourth board 4d so as not to overlap with each other. The tenth electrode member 6d, the eleventh electrode member 10d, and the twelfth electrode member 14d are, for example, plate-shaped members made of Cu. In FIG. 2, each of the tenth electrode member 6d and the eleventh electrode member 10d has an L shape. A tenth planar portion 8d (an example of a fourth positive terminal) and an eleventh planar portion 12d (an example of a fourth output terminal), which are end portions of the tenth electrode member 6d and the eleventh electrode member 10d, are provided close to the third board 4c (on the side of the third board 4c). On the other hand, in FIG. 2, the twelfth electrode member 14d has a rectangular shape and has a twelfth planar portion 16d (an example of a fourth negative terminal). The shapes of the tenth electrode member 6d, the eleventh electrode member 10d, and the twelfth electrode member 14d are not limited to these shapes.

Seventh semiconductor elements 32a, 32b, and 32c are provided on the tenth electrode member 6d, for example, in a portion separated from the tenth planar portion 8d. The seventh semiconductor elements 32a, 32b, and 32c are, for example, IGBTs. However, the semiconductor elements may be MOSFETs or the like. In particular, n-type MOSFETs are preferably used. The seventh semiconductor elements 32a, 32b, and 32c correspond to the high side transistors illustrated in FIG. 1. In addition, the number of seventh semiconductor elements is not particularly limited.

The seventh semiconductor element 32a illustrated in FIG. 3G has a thirteenth electrode (an example of a collector electrode) 33a on the lower surface and a fourteenth electrode (an example of an emitter electrode) 33b on the upper surface. In addition, the same applies to the seventh semiconductor elements 32b and 32c.

Eighth semiconductor elements 34a, 34b, and 34c are provided on the eleventh electrode member 10d, for example, in a portion separated from the eleventh planar portion 12d. The eighth semiconductor elements 34a, 34b, and 34c are, for example, IGBTs. However, the semiconductor elements may be MOSFETs or the like. In particular, n-type MOSFETs are preferably used. The eighth semiconductor elements 34a, 34b, and 34c correspond to the low side transistors illustrated in FIG. 1. In addition, the number of eighth semiconductor elements is not particularly limited.

The eighth semiconductor element 34a illustrated in FIG. 3H has a fifteenth electrode (an example of a collector electrode) 35a on the lower surface and a sixteenth electrode (an example of an emitter electrode) 35b on the upper surface. In addition, the same applies to the eighth semiconductor elements 34b and 34c.

In addition, in a case where the semiconductor element is an n-type MOSFET, a source electrode is provided on the upper surface, and a drain electrode is provided on the lower surface.

A seventh wire 18g electrically connects the fourteenth electrode of the seventh semiconductor element and the eleventh electrode member 10d. An eighth wire 18h electrically connects the sixteenth electrode of the eighth semiconductor element and the twelfth electrode member 14d. The seventh wire 18g and the eighth wire 18h are, for example, bonding wires. However, the wires are not limited to the bonding wires.

The first planar portion 8a, the fourth planar portion 8b, the seventh planar portion 8c, and the tenth planar portion 8d are connected to the positive electrode 212 of the DC power supply 210 and the smoothing capacitor 220 via the positive terminal P (FIG. 1).

The second planar portion 12a, the fifth planar portion 12b, the eighth planar portion 12c and the eleventh planar portion 12d are connected to the output terminal AC (FIG. 1).

The third planar portion 16a, the sixth planar portion 16b, the ninth planar portion 16c, and the twelfth planar portion 16d are connected to the negative electrode 214 of the DC power supply 210 and the smoothing capacitor 220 via the negative terminal N (FIG. 1).

The first electrode member 6a and the fourth electrode member 6b, the second electrode member 10a and the fifth electrode member 10b, and the third electrode member 14a and the sixth electrode member 14b are plane-symmetrical with respect to the plane perpendicular to the main board 2 (provided at positions facing each other) between the first board 4a and the second board 4b.

The seventh electrode member 6c and the tenth electrode member 6d, the eighth electrode member 10c and the eleventh electrode member 10d, and the ninth electrode member 14c and the twelfth electrode member 14d are plane-symmetrical with respect to the plane perpendicular to the main board 2 (provided at positions facing each other) between the third board 4c and the fourth board 4d.

The first electrode member 6a and the seventh electrode member 6c, the second electrode member 10a and the eighth electrode member 10c, and the third electrode member 14a and the ninth electrode member 14c are plane-symmetrical with respect to the plane perpendicular to the main board 2 (provided at positions facing each other) between the first board 4a and the third board 4c.

The fourth electrode member 6b and the tenth electrode member 6d, the fifth electrode member 10b and the eleventh electrode member 10d, and the sixth electrode member 14b and the twelfth electrode member 14d are plane-symmetrical with respect to the plane perpendicular to the main board 2 (provided at positions facing each other) between the second board 4b and the fourth board 4d.

Figure 4A:
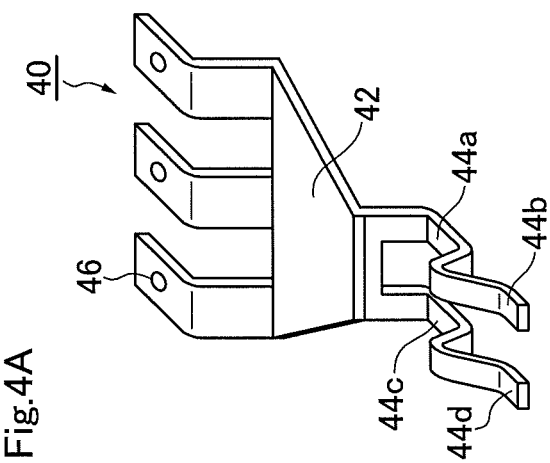
FIGS. 4A to 4C are schematic perspective views of terminal plates of the embodiment.
Figure 4B:
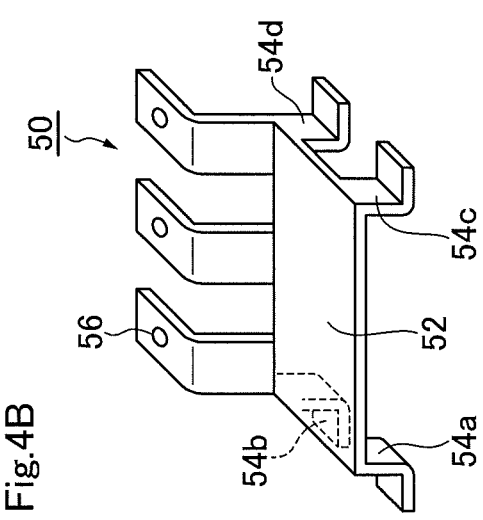
Figure 4C:
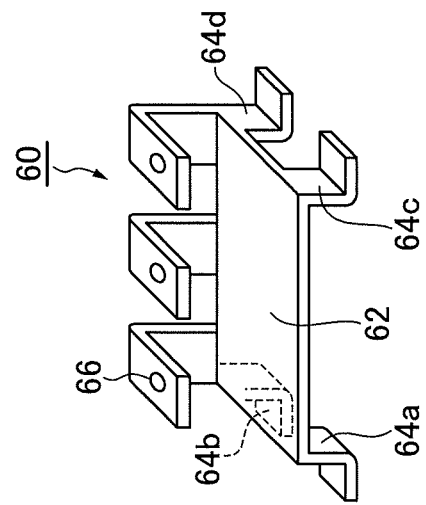

FIGS. 4A to 4C are schematic perspective views of terminal plates of the embodiment. A first terminal plate 40 illustrated in FIG. 4A is a terminal plate for connection to the first planar portion 8a, the fourth planar portion 8b, the seventh planar portion 8c, and the tenth planar portion 8d. For example, a plate portion 44a is connected to the first planar portion 8a. A plate portion 44b is connected to the fourth planar portion 8b. A plate portion 44c is connected to the seventh planar portion 8c. A plate portion 44d is connected to the tenth planar portion 8d. Further, a plate portion 42 is connected with the plate portion 44a and the plate portion 44c. The plate portion 44b is connected to the plate portion 44a. In other words, the plate portion 44b is connected to the plate portion 42 via the plate portion 44a. The plate portion 44d is connected to the plate portion 44c. In other words, the plate portion 44d is connected to the plate portion 42 via the plate portion 44c. Holes 46 are provided for connection to the positive electrode 212 of the DC power supply 210 and the smoothing capacitor 220 (FIG. 1).

A second terminal plate 50 illustrated in FIG. 4B is a terminal plate for connection to the second planar portion 12a, the fifth planar portion 12b, the eighth planar portion 12c, and the eleventh planar portion 12d. The second terminal plate 50 has holes 56, a first plate portion 52, a first wiring portion 54a, a second wiring portion 54b, a third wiring portion 54c, and a fourth wiring portion 54d. One end of the first wiring portion 54a is connected to the first plate portion 52, and the other end is connected to the second planar portion 12a. One end of the second wiring portion 54b is connected to the first plate portion 52, and the other end is connected to the fifth planar portion 12b. One end of the third wiring portion 54c is connected to the first plate portion 52, and the other end is connected to the eighth planar portion 12c. One end of the fourth wiring portion 54d is connected to the first plate portion 52, and the other end is connected to the eleventh planar portion 12d. The holes 56 are provided for connection to the output terminals AC (FIG. 1).

A third terminal plate 60 illustrated in FIG. 4C is a terminal plate for connection to the third planar portion 16a, the sixth planar portion 16b, the ninth planar portion 16c, and the twelfth planar portion 16d. The third terminal plate 60 has holes 66, a second plate portion 62, a fifth wiring portion 64a, a sixth wiring portion 64b, a seventh wiring portion 64c, and an eighth wiring portion 64d. One end of the fifth wiring portion 64a is connected to the second plate portion 62, and the other end is connected to the third planar portion 16a. One end of the sixth wiring portion 64b is connected to the second plate portion 62, and the other end is connected to the sixth planar portion 16b. One end of the seventh wiring portion 64c is connected to the second plate portion 62, and the other end is connected to the ninth planar portion 16c. One end of the eighth wiring portion 64d is connected to the second plate portion 62, and the other end is connected to the twelfth planar portion 16d. The holes 66 are provided for connection to the negative electrode 214 of the DC power supply 210 and the smoothing capacitor 220 (FIG. 1) via the negative terminal N.

The first terminal plate 40, the second terminal plate 50, and the third terminal plate 60 is preferably formed as a one-piece component by using, for example, a metal plate and molding, for example, a plate made of Cu with a thickness of about 1 mm or more and 1.5 mm or less because the component can be easily manufactured. However, the method of manufacturing the first terminal plate 40, the second terminal plate 50, and the third terminal plate 60 is not limited to this.

FIG. 5 is a schematic view of the wires of the embodiment. A wire 80a (an example of a second wire) connects the third electrode member 14a and the sixth electrode member 14b. A wire 80b (an example of a first wire) connects the second electrode member 10a and the fifth electrode member 10b. A wire 80c (an example of a third wire) connects the first electrode member 6a and the fourth electrode member 6b. A wire 80d connects the ninth electrode member 14c and the twelfth electrode member 14d. A wire 80e connects the eighth electrode member 10c and the eleventh electrode member 10d. A wire 80f connects the seventh electrode member 6c and the tenth electrode member 6d. A wire 80g (an example of a sixth wire) connects the third electrode member 14a and the ninth electrode member 14c. A wire 80h (an example of a fifth wire) connects the second electrode member 10a and the eighth electrode member 10c. A wire 80i (an example of a fourth wire) connects the first electrode member 6a and the seventh electrode member 6c. A wire 80j connects the sixth electrode member 14b and the twelfth electrode member 14d. A wire 80k electrically connects the fifth electrode member 10b and the eleventh electrode member 10d. A wire 80l electrically connects the fourth electrode member 6b and the tenth electrode member 6d. In addition, in order to illustrate the wires 80, the illustration of the first semiconductor elements 20a to 20c, the second semiconductor elements 22a to 22c, the third semiconductor elements 24a to 24c, the fourth semiconductor elements 26a to 26c, the fifth semiconductor elements 28a to 28c, the sixth semiconductor elements 30a to 30c, the seventh semiconductor elements 32a to 32c, the eighth semiconductor elements 34a to 34c, the first wire 18a, the second wire 18b, the third wire 18c, the fourth wire 18d, the fifth wire 18e, the sixth wire 18f, the seventh wire 18g, and the eighth wire 18h is omitted. The wires 80 are, for example, bonding wires. However, the wires are not limited to the bonding wires.

Next, functions and effects of the embodiment will be described.

When power conversion is performed by using the power conversion device 200, heat is generated from power conversion device 200. In order to dissipate this heat, the main board 2 is desired to have good thermal conductivity. However, if a ceramic such as AlN (aluminum nitride) is used, the main board 2 may be stressed and cracked at the time when the main board 2 is fixed. Therefore, a material containing Cu or AlSiC which has electrical conductivity and thus, has good thermal conductivity is used as the main board 2.

The boards 4 are made of an insulating ceramic such as AlN or SiN in order to provide the semiconductor elements on the main board 2 having electrical conductivity. Herein, if the boards 4 are too large on the main board 2, the difference in warpage between the boards 4 and the main board 2 due to the difference in thermal expansion coefficient becomes too large, so that the boards 4 are peeled off from the main board 2. Therefore, it is preferable to provide a plurality of the boards 4 on the main board 2 so that the size per board is not too large.

In addition, with respect to the semiconductor elements, if a semiconductor element that is too large is used, it is difficult to secure a yield, so that a semiconductor element that is not large enough to secure the yield is used. On the other hand, the content of the electrical current that can be handled in one semiconductor element that is not large is naturally limited. As a result, a plurality of the boards are provided, and a plurality of the semiconductor elements are further mounted on the respective boards, and these semiconductor elements are used in a state of being connected by electrode members or wires. Then, since a large amount of power is converted by a plurality of the semiconductor elements as a whole, it is important how to dispose the electrode members and the semiconductor elements on the boards and how to connect and use the semiconductor elements in order to realize small conversion loss as much as possible.

Figure 6:
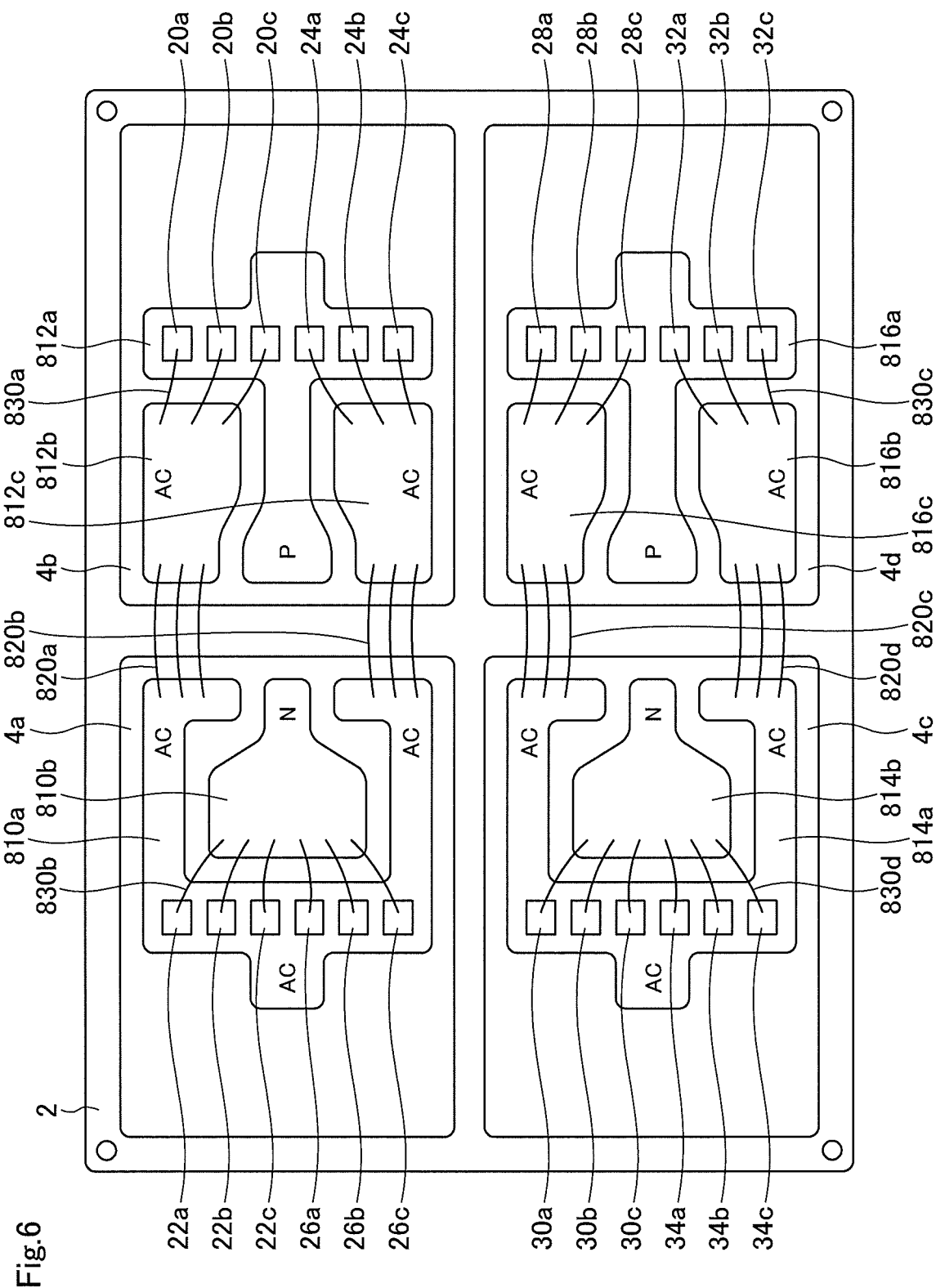
FIG. 6 is a schematic top view of a main board, boards, electrode members, semiconductor elements, and bonding wires in a semiconductor device according to Comparative Example.

FIG. 6 is a schematic top view of a main board, boards, electrode members, semiconductor elements, and bonding wires in a semiconductor device 800 according to Comparative Example. In addition, the semiconductor element in FIG. 6 is described on the assumption that the semiconductor element is an IGBT. In FIG. 6, unlike the semiconductor device 100, the first semiconductor elements 20a, 20b, and 20c functioning as high side transistors and the third semiconductor elements 24a, 24b, and 24c functioning as high side transistors are provided on the same electrode member 812a on the second board 4b. The emitter electrodes of the first semiconductor elements 20a, 20b, and 20c are connected to an electrode member 812b by wires 830a, and the emitter electrodes of the third semiconductor elements 24a, 24b, and 24c are connected to an electrode member 812c by the wires 830a. The electrode member 812b and the electrode member 812c are connected to the output terminal AC. On the other hand, the collector electrodes of the first semiconductor elements 20a, 20b, and 20c and the collector electrodes of the third semiconductor elements 24a, 24b, and 24c are connected to the electrode member 812a.

In addition, unlike the semiconductor device 100, the second semiconductor elements 22a, 22b, and 22c functioning as low side transistors and the fourth semiconductor elements 26a, 26b, and 26c functioning as low side transistors are provided on the same electrode member 810a on the first board 4a. The emitter electrodes of the second semiconductor elements 22a, 22b, and 22c and the emitter electrodes of the fourth semiconductor elements 26a, 26b, and 26c are connected to the electrode member 810b by wires 830b. The collector electrodes of the second semiconductor elements 22a, 22b, and 22c and the collector electrodes of the fourth semiconductor elements 26a, 26b, and 26c are connected to the electrode member 810a. The electrode member 810a is connected to the electrode member 812b and the electrode member 812c by wires 820a and wires 820b, respectively.

In addition, the configurations on the third board 4c and the fourth board 4d are understood in the same manner as described above, and thus the description is omitted.

If the high side transistors and the low side transistors are separately disposed on the respective boards 4 in this manner, it is preferable to provide the wires 820a and the wires 820b in order to equalize the potentials of the electrode members connected to the output terminals AC. However, there is a problem that the wires connected across the plurality of boards 4 like the wires 820a and the wires 820b tend to be long, and thus, this causes large inductance.

In addition, the current with the power converted by the power conversion device flows, for example, from an electrode member connected to the positive terminal P to an electrode member connected to the negative terminal N via an electrode member connected to the output terminal AC. For this reason, the current passes through, for example, the electrode member 812a, the wires 830a, the electrode member 812b, the wires 820a, the electrode member 810a, the second semiconductor elements 22a, 22b, and 22c, the fourth semiconductor elements 26a, 26b, and 26c, and the wires 830b to flow to the electrode member 810b in a loop shape. Since the main board 2 has electrical conductivity, the magnetic flux generated accompanying the current flowing in the loop shape is canceled to some extent because the current flowing in the main board 2 so as to cancel the magnetic flux is generated.

However, since the wires 820a and the wires 820b are long, these wires tend to be formed relatively away from the surface of the main board 2. For this reason, it is difficult to cancel the magnetic flux accompanying the current flowing in the wires 820a and the wires 820b by the current flowing in the main board 2. Therefore, if the wires connected across a plurality of the boards 4 like the wires 820a and the wires 820b are provided, there is a problem that the inductance in the power conversion device increases.

Therefore, in the semiconductor device according to the embodiment, the first semiconductor elements 20a, 20b, and 20c which are high side transistors and the third semiconductor elements 24a, 24b, and 24c which are high side transistors are separately provided on the first board 4a and the second board 4b, respectively. In addition, the second semiconductor elements 22a, 22b, and 22c which are low side transistors and the fourth semiconductor elements 26a, 26b, and 26c which are low side transistors are separately provided on the first board 4a and third board 4c, respectively. Then, connection between different boards is performed by using a terminal plate without providing wires over a plurality of boards like the wires 820a and the wires 820b.

In this case, long wires such as the wires 820a and 820b may not be provided. Therefore, it is possible to provide a semiconductor device with a small inductance while avoiding the above-described problem of the increase in inductance.

The first planar portion 8a, the second planar portion 12a, and the third planar portion 16a are provided close to the second board 4b, and the fourth planar portion 8b, the fifth planar portion 12b, and the sixth planar portion 16b are provided close to the first board 4a, so that connection by a small terminal plate becomes possible, and thus, it is possible to provide a semiconductor device with a small inductance. In addition, the same applies to the configurations on the third board 4c and the fourth board 4d.

The first electrode member 6a and the fourth electrode member 6b are plane-symmetrical with respect to a plane perpendicular to the main board 2 between the first board 4a and the second board 4b. The second electrode member 10a and the fifth electrode member 10b are plane-symmetrical with respect to the plane perpendicular to the main board 2 between the first board 4a and the second board 4b. The third electrode member 14a and the sixth electrode member 14b are plane-symmetrical with respect to the plane perpendicular to the main board 2 between the first board 4a and the second board 4b. Accordingly, the configuration of the terminal plate can be simplified. In particular, in the semiconductor device 100 according to the embodiment, since a total of three terminal plates (the first terminal plate 40, the second terminal plate 50, and the third terminal plate 60) are provided, if the electrode members are not configured to be plane-symmetrical as described above, the configurations of the terminal plates become complicated, and thus, this causes an increase in inductance.

Similarly, the seventh electrode member 6c and the tenth electrode member 6d, the eighth electrode member 10c and the eleventh electrode member 10d, and the ninth electrode member 14c and the twelfth electrode member 14d are plane-symmetrical with respect to a plane perpendicular to the main board 2 between the third board 4c and the fourth board 4d.

Similarly, the first electrode member 6a and the seventh electrode member 6c, the second electrode member 10a and the eighth electrode member 10c, and the third electrode member 14a and the ninth electrode member 14c are plane-symmetrical with respect to a plane perpendicular to the main board 2 between the first board 4a and the third board 4c.

Similarly, the fourth electrode member 6b and the tenth electrode member 6d, the fifth electrode member 10b and the eleventh electrode member 10d, and the sixth electrode member 14b and the twelfth electrode member 14d are plane-symmetrical with respect to a plane perpendicular to the main board 2 between the second board 4b and the fourth board 4d.

As illustrated in FIG. 4B, it is preferable that the second terminal plate 50 is provided with the first wiring portion 54a, the second wiring portion 54b, the third wiring portion 54c, and the fourth wiring portion 54d directly connected to the first plate portion 52, and the first wiring portion 54a, the second wiring portion 54b, the third wiring portion 54c, and the fourth wiring portion 54d are connected to the respective electrode members. As a comparison, if the first terminal plate 40 illustrated in FIG. 4A is considered, since the electrode member connected to the plate portion 44b is connected via the plate portion 44a, the electrode member connected to the plate portion 44b has a larger inductance than the electrode members connected to the plate portion 44a. Similarly, since the electrode member connected to the plate portion 44d is connected via the plate portion 44c, the electrode member connected to the plate portion 44d has a larger inductance than the electrode member connected to the plate portion 44c. Thus, it is not preferable that different inductances with the plate portion 42 occur depending on the electrode members to be connected. In the case of the second terminal plate 50, this problem can be avoided. In addition, for the same reason, the third terminal plate 60 is also a terminal plate which can avoid this problem.

In particular, with respect to the third terminal plate 60 connected to the N terminal and the second terminal plate 50 connected to the AC terminal, which are closer to ground, a structure in which different inductances are less likely to occur depending on the electrode members to be connected is preferable. On the other hand, the first terminal plate 40 connected to the P terminal has relatively few problems even if the first terminal plate 40 has a structure in which different inductances occur. Of course, the terminal plate connected to the P terminal may have a structure like the second terminal plate 50 or the third terminal plate 60.

The wires 80 are preferably used to further reduce the potential difference generated between the electrode members connected to the same terminal (P, AC, or N).

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a main board;
    a first board provided on the main board;
    a first semiconductor element provided on the first board;
    a second semiconductor element provided on the first board;
    a first positive terminal provided on the first board;
    a first negative terminal provided on the first board;
    a first output terminal provided on the first board;
    a second board provided on the main board;
    a third semiconductor element provided on the second board;
    a fourth semiconductor element provided on the second board;
    a second positive terminal provided on the second board;
    a second negative terminal provided on the second board;
    a second output terminal provided on the second board; and
    at least one terminal plate of a first terminal plate connecting the first positive terminal and the second positive terminal, a second terminal plate connecting the first negative terminal and the second negative terminal, and a third terminal plate connecting the first output terminal and the second output terminal.

2. The semiconductor device according to claim 1, further comprising:
    a first electrode member having the first positive terminal;
    a second electrode member having the first output terminal;
    a third electrode member having the second positive terminal; and
    a fourth electrode member having the second output terminal,
    wherein the first semiconductor element is provided on the first electrode member, the second semiconductor element is provided on the second electrode member, the third semiconductor element is provided on the third electrode member, and the fourth semiconductor elements is provided on the fourth electrode member.

3. The semiconductor device according to claim 2, further comprising:

a fifth electrode member having the first negative terminal; and a sixth electrode member having the second negative terminal.

4. The semiconductor device according to claim 3, wherein the first electrode member and the third electrode member are provided at positions facing each other, wherein the second electrode member and the fourth electrode member are provided at positions facing each other, and wherein the fifth electrode member and the sixth electrode member are provided at positions facing each other.

5. The semiconductor device according to claim 3, further comprising a second wire connecting the fifth electrode member and the sixth electrode member.

6. The semiconductor device according to claim 2, further comprising:

a third board provided on the main board;

a seventh electrode member provided on the third board and having a third negative terminal;

a fourth board provided on the main board; and an eighth electrode member provided on the fourth board and having a fourth negative terminal, wherein the second terminal plate includes:

a first plate portion;

a first wiring portion having one end connected to the first plate portion and the other end connected to the first negative terminal;

a second wiring portion having one end connected to the first plate portion and the other end connected to the second negative terminal;

a third wiring portion having one end connected to the first plate portion and the other end connected to the third negative terminal; and a fourth wiring portion having one end connected to the first plate portion and the other end connected to the fourth negative terminal.

7. The semiconductor device according to claim 6, further comprising:

a ninth electrode member provided on the third board and having a third output terminal; and a tenth electrode member provided on the fourth board and having a fourth output terminal, wherein the third terminal plate includes:

a second plate portion;

a fifth wiring portion having one end connected to the second plate portion and the other end connected to the first output terminal;

a sixth wiring portion having one end connected to the second plate portion and the other end connected to the second output terminal;

a seventh wiring portion having one end connected to the second plate portion and the other end connected to the third output terminal; and an eighth wiring portion having one end connected to the second plate portion and the other end connected to the fourth output terminal.

8. The semiconductor device according to claim 7, further comprising:

an eleventh electrode member provided on the third board and having a third positive terminal;

a twelfth electrode member provided on the fourth board and having a fourth positive terminal;

a fifth semiconductor element provided on the eleventh electrode member;

a sixth semiconductor element provided on the ninth electrode member and electrically connected in series to the fifth semiconductor element;

a seventh semiconductor element provided on the twelfth electrode member; and an eighth semiconductor element provided on the tenth electrode member and electrically connected in series to the seventh semiconductor element.

9. The semiconductor device according to claim 8, wherein the first terminal plate further connects the third positive terminal and the fourth positive terminal.

10. The semiconductor device according to claim 8, further comprising a fourth wire connecting the first electrode member and the eleventh electrode member.

11. The semiconductor device according to claim 7, further comprising a fifth wire connecting the second electrode member and the ninth electrode member.

12. The semiconductor device according to claim 2, further comprising a first wire connecting the second electrode member and the fourth electrode member.

13. The semiconductor device according to claim 2, further comprising a third wire connecting the first electrode member and the third electrode member.

14. The semiconductor device according to claim 1, wherein the first semiconductor element and the second semiconductor element are electrically connected in series, and wherein the third semiconductor element and the fourth semiconductor element are electrically connected in series.

* * * * *